United States Patent
Chen et al.

(10) Patent No.: US 11,839,120 B2
(45) Date of Patent: Dec. 5, 2023

(54) ELECTRONIC DEVICE WITH CONDUCTIVE VIA STRUCTURES

(71) Applicant: Industrial Technology Research Institute, Hsinchu (TW)

(72) Inventors: Wei-Chung Chen, Kaohsiung (TW); Wen-Yu Kuo, Hsinchu County (TW); Chieh-Wei Feng, Taoyuan (TW); Tai-Jui Wang, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 222 days.

(21) Appl. No.: 17/037,737

(22) Filed: Sep. 30, 2020

(65) Prior Publication Data

US 2021/0098558 A1 Apr. 1, 2021

Related U.S. Application Data

(60) Provisional application No. 62/908,619, filed on Oct. 1, 2019.

(30) Foreign Application Priority Data

Aug. 24, 2020 (TW) .................................. 109128727

(51) Int. Cl.
*H10K 59/131* (2023.01)
*H10K 59/121* (2023.01)
*H10K 59/122* (2023.01)

(52) U.S. Cl.
CPC ......... *H10K 59/131* (2023.02); *H10K 59/121* (2023.02); *H10K 59/122* (2023.02)

(58) Field of Classification Search
CPC ............. H01L 21/76898; H01L 23/528; H01L 23/5226; H01L 27/14636; H01L 27/124; H01L 27/1255; G09G 3/3266; G02F 2201/42; G02F 1/13452; H05K 999/00; H10K 59/131; H10K 59/121; H10K 59/122
USPC ........................................................ 257/72
See application file for complete search history.

(56) References Cited

U.S. PATENT DOCUMENTS 9,298,300 B2 3/2016 Roudbari et al.
2013/0120231 A1 5/2013 Jo et al.
2014/0327632 A1* 11/2014 Roudbari .............. G06F 3/0412
345/173

(Continued)

FOREIGN PATENT DOCUMENTS

CN 101937894 11/2012
CN 202816322 3/2013

(Continued)

*Primary Examiner* — Nduka E Ojeh
*Assistant Examiner* — Laura M Dykes
(74) *Attorney, Agent, or Firm* — JCIPRNET

(57) ABSTRACT

An electronic device including a pixel array structure, a redistribution structure, and a plurality of conductive via structures is provided. The pixel array structure includes a plurality of signal lines. The redistribution structure overlaps the pixel array structure and includes a plurality of conductive lines. The conductive via structures electrically connect the signal lines of the pixel array structure and the conductive lines of the redistribution structure. At least one of the conductive via structures shares at least one conductive layer with the pixel array structure.

12 Claims, 16 Drawing Sheets

(56) References Cited

U.S. PATENT DOCUMENTS

| | | | |
|---|---|---|---|
| 2014/0375916 A1* | 12/2014 | Chen .................... | H01L 27/1218 349/33 |
| 2016/0111481 A1* | 4/2016 | Jeong .................. | H01L 27/3276 257/40 |
| 2017/0222059 A1* | 8/2017 | Chen .................... | H01L 27/1222 |
| 2019/0103425 A1 | 4/2019 | Yoon et al. | |
| 2019/0235664 A1 | 8/2019 | Kwak et al. | |
| 2020/0127073 A1* | 4/2020 | Ke ....................... | H01L 27/1262 |
| 2020/0328266 A1* | 10/2020 | Liu ...................... | H10K 59/121 |
| 2021/0210522 A1* | 7/2021 | Liu ...................... | H01L 27/124 |

FOREIGN PATENT DOCUMENTS

| | | |
|---|---|---|
| CN | 104916252 | 9/2015 |
| CN | 106847864 | 6/2017 |
| CN | 109509425 | 3/2019 |

\* cited by examiner

ELECTRONIC DEVICE WITH CONDUCTIVE VIA STRUCTURES

CROSS-REFERENCE TO RELATED APPLICATION

This application claims the priority benefits of U.S. provisional application Ser. No. 62/908,619, filed on Oct. 1, 2019, and Taiwan application serial no. 109128727, filed on Aug. 24, 2020. The entirety of each of the above-mentioned patent applications is hereby incorporated by reference herein.

BACKGROUND

Technical Field

The disclosure relates to an electronic device.

Description of Related Art

The driver circuit in an electronic device is disposed at the periphery of the active region most of the time, and the signal lines in the active region are electrically connected to the driver circuit through the peripheral circuit arranged outside the active region. The peripheral circuit occupies a certain wiring area, which that a narrow frame design of the electronic device may not be easily achieved. Besides, for small sizes or high resolution of electronic devices rises, the resistive-capacitive loading (RC loading) problem caused by an excessively long peripheral circuit may be easily generated. As such, uniformity of the performance of the electronic device is affected, for example, poor uniformity of brightness or electrical performance is provided.

SUMMARY

An electronic device provided by an embodiment of the disclosure includes a pixel array structure, a redistribution structure, and a plurality of conductive via structures. The pixel array structure includes a plurality of signal lines. The redistribution structure overlaps the pixel array structure and includes a plurality of conductive lines. The conductive via structures electrically connect the signal lines of the pixel array structure and the conductive lines of the redistribution structure. At least one of the conductive via structures shares at least one conductive layer with the pixel array structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In the following embodiments, wording used to indicate directions, such as "up," "down," "front," "back," "left," and "right," merely refers to directions in the accompanying figures. Therefore, the directional wording is used to illustrate rather than limit the disclosure.

In the accompanying figures, common characteristics of the methods, structures and/or materials used in exemplary embodiments are shown. However, the drawings should not be interpreted to define or limit the scopes or the properties of the descriptions in the exemplary embodiments. For instance, for clarity, the relative size, thickness and location of each film layer, region, and/or structure may be reduced or enlarged, and/or illustration of certain elements or film layers may be omitted.

Terms such as "first" and "second" in the specification or claims are used only to name different elements or to distinguish different embodiments or scopes and should not be construed as the upper limit or lower limit of the number of any elements and should not be construed to limit a manufacturing order or an arrangement order of the elements. In addition, one element/film layer disposed on (or above) another element/film layer may cover a situation that an additional element/film layer exists or does not exist between the two elements/film layers. In other words, the element/film layer may be directly or indirectly disposed on (or above) the other element/film layer. Further, in the situation that one element/film layer is directly disposed on (or above) the other element/film layer means that the two elements/film layers directly contact with each other, and no additional element/film layer exists between the two elements/film layers.

Figure 1:
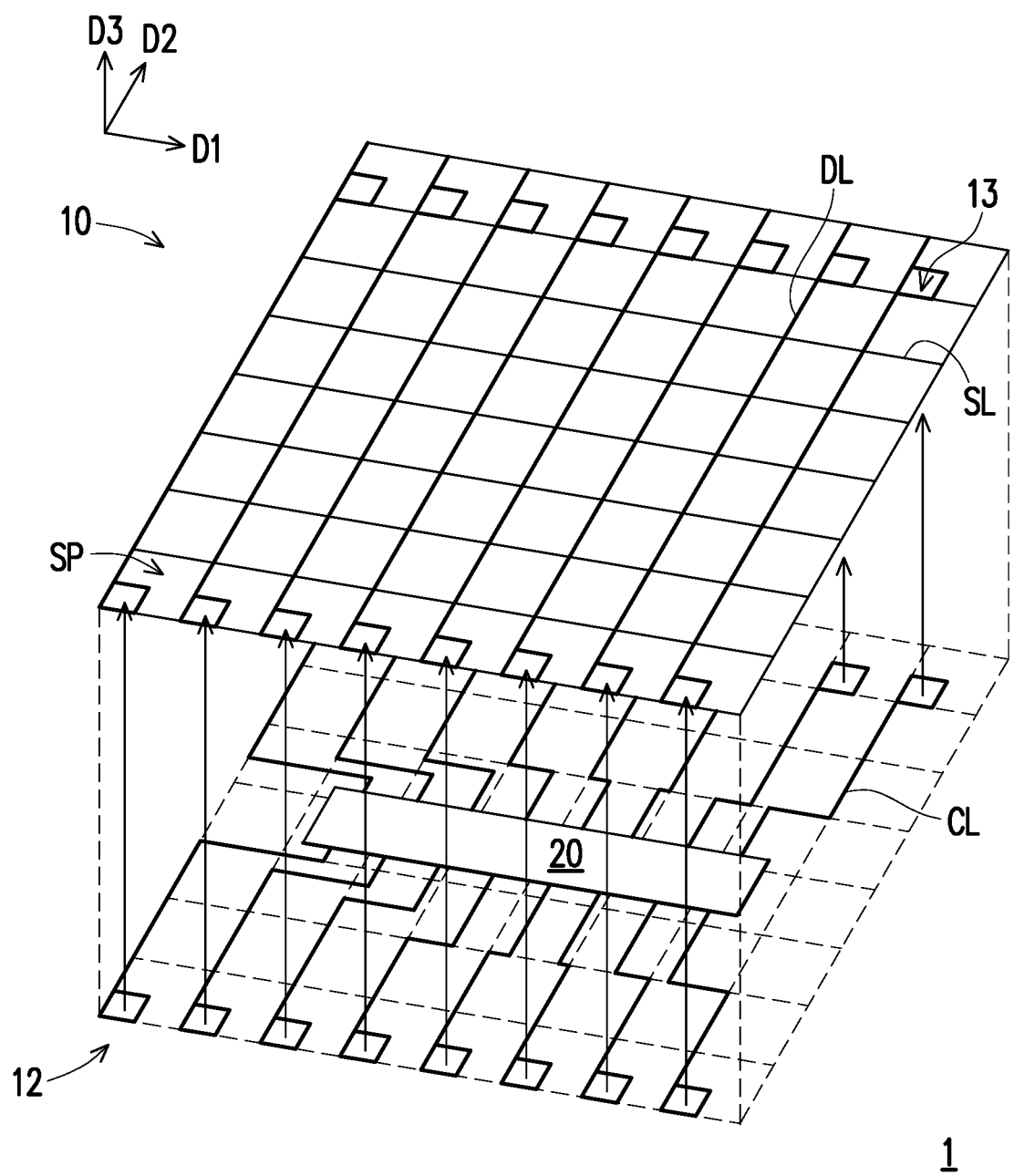
FIG. 1 to FIG. 3 respectively are a local three-dimensional schematic view, a local cross-sectional schematic view, and a local top schematic view of an electronic device according to a first embodiment of the disclosure.
Figure 2:
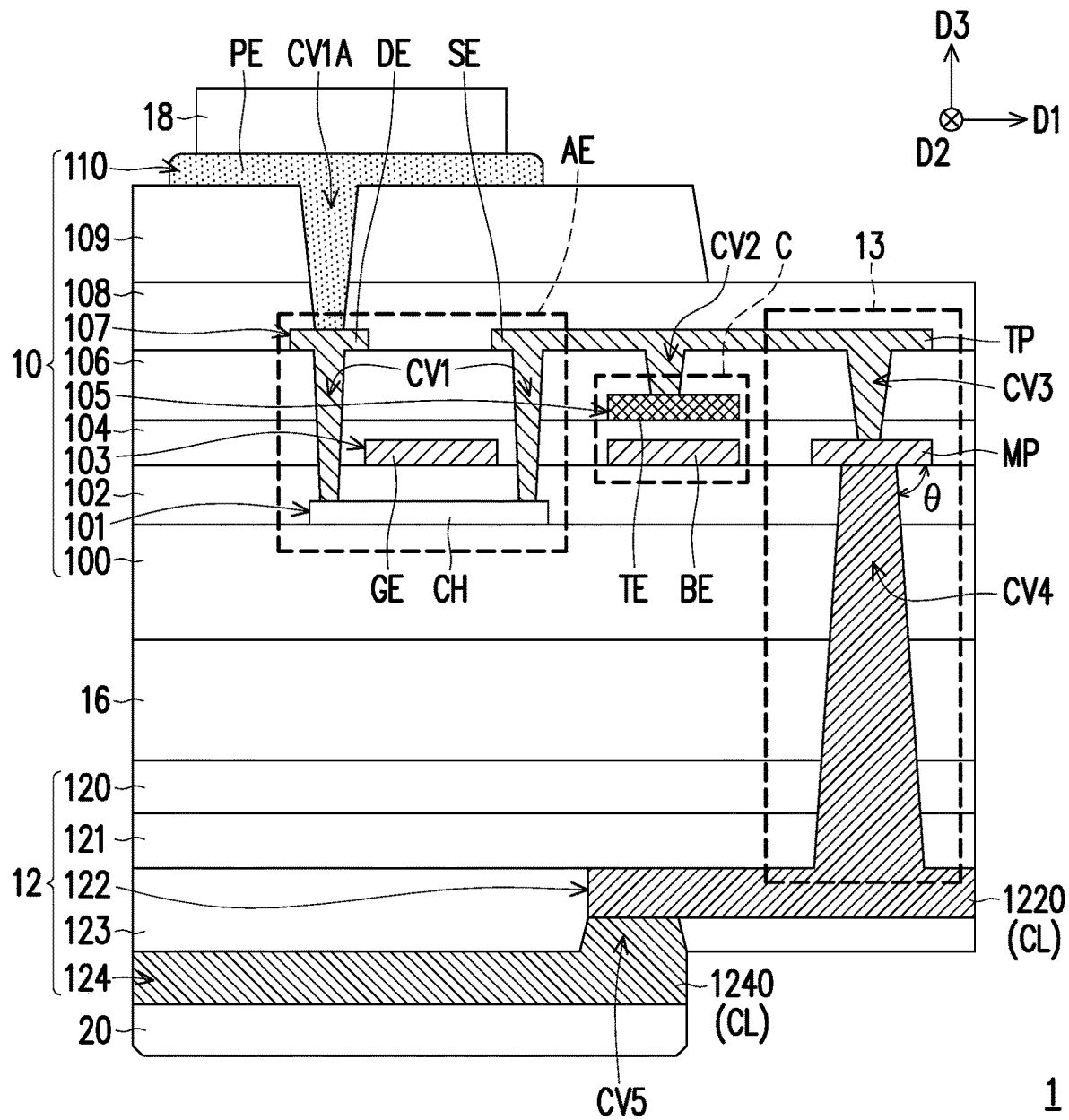
Figure 3:
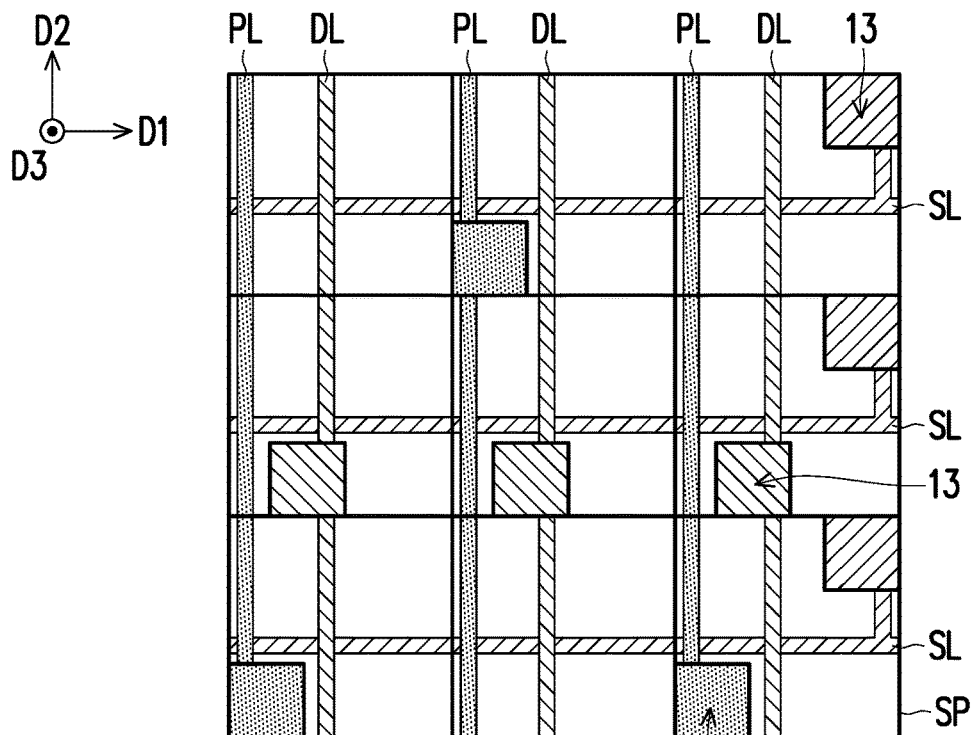

FIG. 1 to FIG. 3 respectively are a local three-dimensional schematic view, a local cross-sectional schematic view, and a local top schematic view of an electronic device according to a first embodiment of the disclosure. With reference to FIG. 1, first, an electronic device 1 may include a pixel array structure 10, a redistribution structure 12, and a plurality of conductive via structures 13, but is not limited thereto.

The pixel array structure 10 includes a plurality of signal lines such as a plurality of scan lines SL and a plurality of data lines DL, but is not limited thereto. The scan lines SL and the data lines DL intersect each other and define a plurality of sub-pixels SP. Each sub-pixel SP may include one scan line SL and one data line DL. Nevertheless, the relative arrangement relationship among the scan lines SL, the data lines DL, and the sub-pixels SP or the number of the scan lines SL and the number of the data lines DL included in each sub-pixel SP may be may be changed according to needs.

The redistribution structure 12 overlaps the pixel array structure 10. In other words, the redistribution structure 12 and the pixel array structure 10 overlap each other in a thickness direction (e.g., a third direction D3) of the electronic device 1. The redistribution structure 12 may include a plurality of conductive lines CL. In some embodiments, as shown in FIG. 1, the conductive lines CL of the redistribution structure 12 may at least partially overlap the signal lines (e.g., the data lines DL and the scan lines SL) of the pixel array structure 10, such that an aperture ratio or a light transmittance of the electronic device 1 is maintained. Any embodiment of the disclosure may be combined with the technical means (that is, the conductive lines CL may at least partially overlap the signal lines) described here without conflict, and related description is not repeated below.

The conductive via structures 13 electrically connect the signal lines (e.g., the data lines DL) of the pixel array structure 10 and the conductive lines CL of the redistribution structure 12. The conductive via structures 13 may include a plurality of conductive structures which are stacked in the thickness direction (e.g., the third direction D3) of the electronic device 1. One of the conductive structures of the conductive via structures 13 may be connected to a corresponding signal line, and another conductive structure of the conductive via structures 13 may be connected to a corresponding conductive line CL. In some embodiments, at least one conductive structure in the conductive via structures 13 and at least one conductive structure in the pixel array structure 10 may be formed by patterning a same conductive layer. In other words, at least one of the conductive via structures 13 may shares at least one conductive layer with the pixel array structure 10.

In some embodiments, the electronic device 1 may further include a driver circuit 20. The driver circuit 20 overlaps the pixel array structure 10 and the redistribution structure 12. Further, the driver circuit 20 may be electrically connected to the signal lines (e.g., the data lines DL) of the pixel array structure 10 through the conductive lines CL of the redistribution structure 12 and the conductive via structure 13.

The signal lines of the pixel array structure 10 may receive a signal from the driver circuit 20 through the conductive lines CL of the redistribution structure 12 and the conductive via structures 13. A peripheral circuit may be not disposed at a periphery of an active region (a region where the sub-pixels SP are located) of the electronic device 1, such that the design of a full narrow frame may thus be achieved. In addition, for small sizes or high resolution rises, a suitable signal transmission path may be provided through design (e.g., sizes, numbers, or locations) of at least one of the conductive via structures 13, the conductive lines CL, and the driver circuit 20, such that the resistive-capacitive loading problem may be improved. In some embodiments, the electronic device 1 may be applied to a borderless mobile phones, a borderless tablet, or an ultra-narrow desktop display. In some embodiments, when the electronic device 1 is required to provide high transmittance (for example, is applied to a transparent display), a micro-driver circuit may be adopted such that the driver circuit 20 may be less visible. In some embodiments, the electronic device 1 may also be applied to a replaceable display module of a large-size spliced display.

FIG. 1 schematically depicts the conductive via structures 13 in a rectangular frame. Herein, each data line DL may be electrically connected to the driver circuit 20 through one or more conductive via structures 13 (upper and lower layers may be the same conductive via or different conductive vias) and one or more conductive lines CL. In a structure where one data line DL is electrically connected to plural conductive via structures 13, two conductive via structures 13 electrically connected to the same data line DL may be located in the sub-pixels SP at two opposite ends of the data line DL. Nevertheless, a shape of the conductive via structures 13 in a top view, the number of the conductive via structures 13 electrically connected to each signal line, the number of the conductive lines CL electrically connected to each signal line, or positions of the conductive via structures 13 in a sub-pixel array may be changed according to needs. Other signal lines (e.g., the scan lines SL) in the pixel array structure 10 may also be electrically connected to the driver circuit 20 through the conductive via structures 13 and the conductive lines CL.

In some embodiments, as shown in FIG. 2, the electronic device 1 may further include a substrate 16 and an element layer 18. According to different needs, other elements/film layers may be further included or at least one of the elements/film layers may be omitted in the electronic device 1.

The substrate 16 is, for example, configured to carry an element, and the substrate 16 may be a rigid substrate or a flexible substrate. For instance, a material of the rigid substrate is, for example, glass, wafer, quartz, or other rigid materials, and a material of the flexible substrate is, for example, polyethylene terephthalate (PET), polyimide (PI), polycarbonate (PC), polyamide (PA), polyethylene naphthalate (PEN), polyethylenimine (PEI), (polyurethane (PU), polydimethylsiloxane (PDMS), an acrylic-based polymer such as polymethylmethacrylate (PMMA) and so forth, an ether-based polymer such as polyethersulfone (PES) or polyetheretherketone (PEEK), polyolefin, thin glass, or other flexible materials. Nevertheless, the disclosure is not limited thereto.

The pixel array structure 10 may be disposed on the substrate 16. In some embodiments, as shown in FIG. 2, the pixel array structure 10 may include a buffer layer 100, a semiconductor layer 101, a gate insulating layer 102, a first conductive layer 103, a first insulating layer 104, a middle conductive layer 105, a second insulating layer 106, a second conductive layer 107, a third insulating layer 108, a fourth insulating layer 109, and a third conductive layer 110. According to different needs, the relative positional relationship of the elements/film layers may be adjusted, other elements/film layers may be further included, or at least one of the elements/film layers may be omitted in the pixel array structure 10.

The buffer layer 100, the semiconductor layer 101, the gate insulating layer 102, the first conductive layer 103, the first insulating layer 104, the middle conductive layer 105, the second insulating layer 106, the second conductive layer 107, the third insulating layer 108, the fourth insulating layer 109, and the third conductive layer 110 are formed on the substrate 16 in sequence, for example. The manufacturing method, materials, and relative arrangement relationship of the above layers may be configured according to needs and are not particularly limited.

Figure 11:
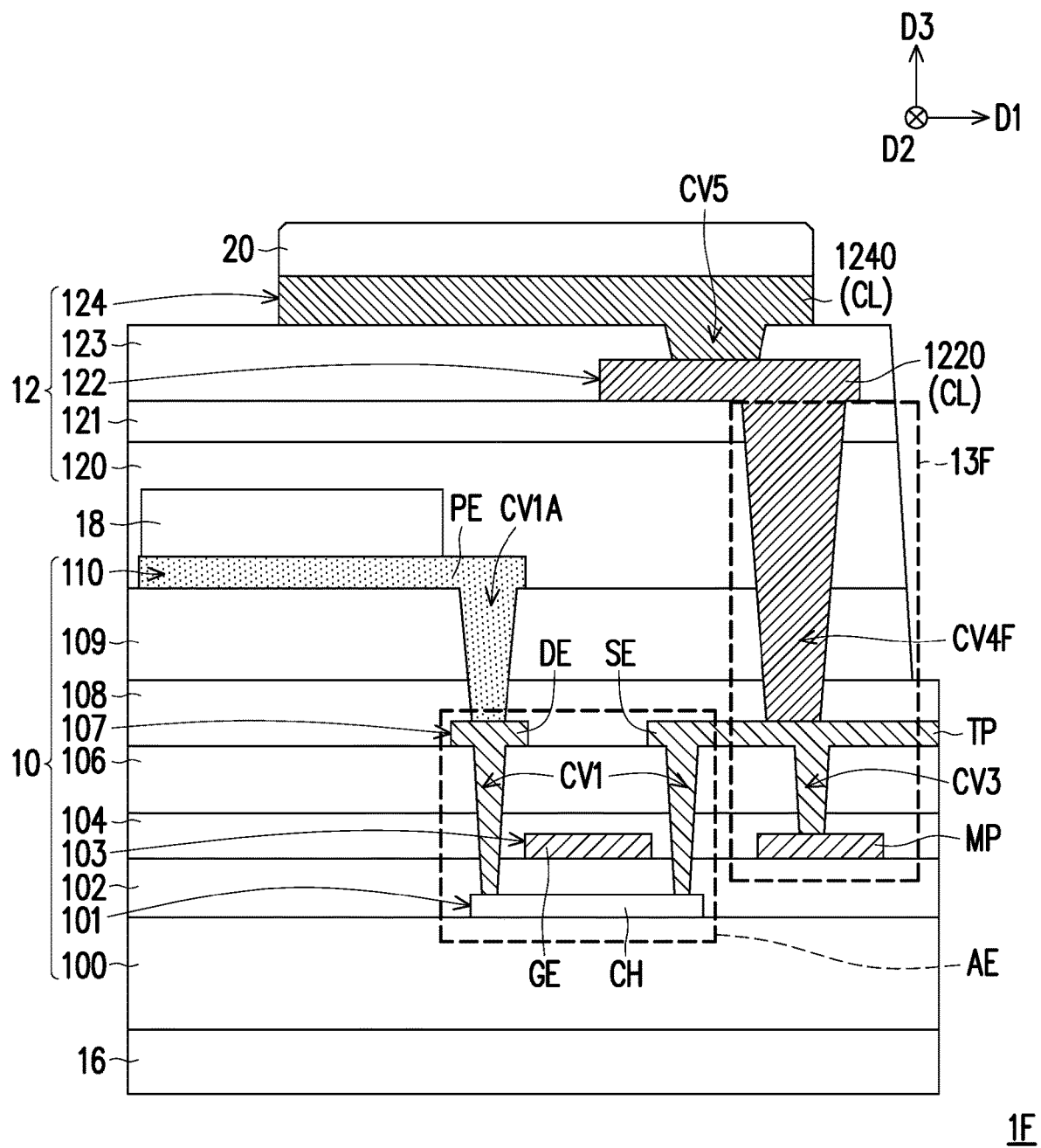
FIG. 11 to FIG. 13 respective are local cross-sectional schematic views of an electronic device according to a seventh embodiment to a ninth embodiment of the disclosure.

In FIG. 2, the pixel array structure 10 may include four layers of conductive layers, such as the first conductive layer 103, the middle conductive layer 105, the second conductive layer 107, and the third conductive layer 110. In some embodiments, based on the consideration of conductivity or signal transmission efficiency, materials of the first conductive layer 103, the middle conductive layer 105, and the second conductive layer 107 may include metal but are not limited thereto. Besides, based on the consideration of aperture ratio and light transmittance, the material of the third conductive layer 110 may include a light-transmitting conductive material but is not limited thereto. According to different needs, the number of the conductive layers in the pixel array structure 10 may be increased or reduced. For instance, the middle conductive layer 105 may not be included in the pixel array structure 10, and the second conductive layer 107 may be disposed on the second insulating layer 106 (as shown in FIG. 11).

In FIG. 2, the semiconductor layer 101 may be a patterned semiconductor layer and includes a plurality of channel patterns CH (one channel pattern CH is schematically shown in FIG. 2). The first conductive layer 103 may be a patterned conductive layer and includes a plurality of scan lines SL (referring to FIG. 3), a plurality of gates GE (one gate GE is schematically shown in FIG. 2), a plurality of bottom electrodes BE (one bottom electrode BE is schematically shown in FIG. 2), and a plurality of middle patterns MP (one middle pattern MP is schematically shown in FIG. 2). In other words, the scan lines SL, the gates GE, the bottom electrodes BE, and the middle patterns MP belong to the same layer. The middle conductive layer 105 may be a patterned conductive layer and includes a plurality of top electrodes TE (one top electrode TE is schematically shown in FIG. 2). The second conductive layer 107 may be a patterned conductive layer and includes a plurality of data lines DL (referring to FIG. 3), a plurality of power lines PL (referring to FIG. 3), a plurality of sources SE (one source SE is schematically shown in FIG. 1), a plurality of drains DE (one drain is schematically shown in FIG. 2), and a plurality of top patterns TP (one top pattern TP is schematically shown in FIG. 2). In other words, the data lines DL, the power lines PL, the sources SE, the drains DE, and the top patterns TP belong to the same layer. In other embodiments, the data lines DL and the power lines PL may be long to different layers. For instance, the power lines PL may be manufactured together with the top electrodes TE, that is, the power lines PL and the top electrodes TE may belong to the same layer. The third conductive layer 110 may be a patterned conductive layer and includes a plurality of pixel electrodes PE (one pixel electrode PE is schematically shown in FIG. 2).

The pixel array structure 10 may include a plurality of active elements AE (one active element AE is schematically shown in FIG. 2). Each active element AE may include one channel pattern CH, one gate GE, one source SE, and one drain DE but is not limited thereto. As shown in FIG. 2, the source SE may be electrically connected to the channel pattern CH through one conductive via CV1 penetrating through the gate insulating layer 102, the first insulating layer 104, and the second insulating layer 106. In addition, the drain DE may be electrically connected to the corresponding channel pattern CH through another conductive via CV1. Besides, the drain DE may further be electrically connected to the corresponding pixel electrode PE through a conductive via CV1A penetrating through the third insulating layer 108 and the fourth insulating layer 109. Nevertheless, the type of the active elements AE and the relative arrangement relationship among the elements in the active elements AE may be changed according to needs and are not limited to the illustration of FIG. 2. For instance, each active element AE may be an amorphous silicon thin film transistor (a-Si TFT), a low temperature poly-silicon (LTPS) thin film transistor, a high temperature poly-silicon (HTPS) thin film transistor, or an oxide TFT but is not limited thereto.

The pixel array structure 10 may further include a plurality of capacitors C (one capacitor C is schematically shown in FIG. 2). Each capacitor C may include one bottom electrode BE and one top electrode TE. In some embodiments, the top electrode TE may be electrically connected to the corresponding source SE through a conductive via CV2 penetrating through the second insulating layer 106.

FIG. 3 schematically depicts the relative arrangement relationship between the signal lines (e.g., the scan lines SL, the data lines DL, and the power lines PL) and the sub-pixels SP in the pixel array structure 10. As shown in FIG. 3, each scan line SL may extend in a first direction D1, and the scan lines SL may be arranged in a second direction D2. The first direction D1 and the second direction D2 intersect each other and both are perpendicular to the thickness direction (e.g., the third direction D3) of the electronic device 1. The first direction D1 and the second direction D2 may be perpendicular to each other but are not limited thereto. Each data line DL may extend in the second direction D2, and the data lines DL may be arranged in the first direction D1. Each power line PL may extend in the second direction D2, and the power lines PL may be arranged in the first direction D1. As shown in FIG. 3, the data lines DL and the power lines PL may be arranged in the first direction D1 in an alternating manner and are not limited thereto. In other embodiments, the signal lines may further include lines of other purposes, such as repair lines (not shown) or shared electrode lines (not shown), but are not limited thereto.

FIG. 3 schematically depicts nine sub-pixels SP with thick solid lines. The nine sub-pixels SP are arranged into a rectangular array in the first direction D1 and the second direction D2. Nevertheless, the number and the arrangement manner of the sub-pixels SP may be changed according to needs (such as the shape of the active region of the electronic device 1). For instance, the sub-pixels SP may also be arranged into a non-rectangular (such as a circular shape or other polygonal or irregular shapes and the like) array. In some embodiments, each sub-pixel SP may include on scan line SL, one data line DL, and one power line PL. Nevertheless, the number of the signal line SL, the number of the data line DL, and the number of the power line PL in each sub-pixel SP or the relative arrangement relationship between each sub-pixel SP and the corresponding scan lines may be changed according to needs.

With reference to FIG. 2 again, the element layer 18 may be disposed on the substrate 16 and overlaps the pixel array structure 10 and the redistribution structure 12. In some embodiments, as shown in FIG., 2, the element layer 18 may be disposed on one side of the pixel array structure 10 away from the substrate 16, for example, may be disposed on the third conductive layer 110, but is not limited thereto. In some embodiments, the element layer 18 may include a display medium layer, such as a liquid crystal layer or an electrophoretic layer, but is not limited thereto. Correspondingly, the electronic device 1 may provide a display function. In other embodiments, the element layer 18 may include a photoelectric conversion layer. For instance, the element layer 18 may include an organic light emitting diode (OLED), a mini LED, a micro LED, or a light sensing element (a photodiode, PD) but is not limited thereto. Correspondingly, the electronic device 1 may provide a lighting function, a display function, or a light sensing function.

The redistribution structure 12 may be disposed on the substrate 16. In some embodiments, the pixel array structure 10 and the redistribution structure 12 are disposed on opposite surfaces of the substrate 16 but are not limited thereto. In some embodiments, as shown in FIG. 2, the redistribution structure 12 may include a buffer layer 120, a first insulating layer 121, a first redistribution conductive layer 122, a second insulating layer 123, and a second redistribution conductive layer 124. According to different needs, other elements/film layers may be further included or at least one of the elements/film layers may be omitted in the redistribution structure 12.

The buffer layer 120, the first insulating layer 121, the first redistribution conductive layer 122, the second insulating layer 123, and the second redistribution conductive layer 124 for formed on the substrate 16, for example. For instance, after the pixel array structure 10 and the element layer 18 are formed, the substrate 16 may be placed upside down, and the buffer layer 120, the first insulating layer 121, the first redistribution conductive layer 122, the second insulating layer 123, and the second redistribution conductive layer 124 may then be manufactured in sequence. The manufacturing method, materials, and relative arrangement relationship of the above layers may be configured according to needs and are not particularly limited.

In FIG. 2, the redistribution structure 12 may include two layers of conductive layers, such as the first redistribution conductive layer 122 and the second redistribution conductive layer 124. In some embodiments, based on the consideration of conductivity or signal transmission efficiency, materials of the first redistribution conductive layer 122 and the second redistribution conductive layer 124 may include metal but are not limited thereto. According to different needs, the number of the redistribution structure 12 may be increased or reduced.

The first redistribution conductive layer 122 may be a patterned conductive layer and includes a plurality of conductive lines 1220 (one conductive line 1220 is schematically shown in FIG. 2). The second redistribution conductive layer 124 may be a patterned conductive layer and includes a plurality of conductive lines 1240 (one conductive line 1240 is schematically shown in FIG. 2). In some embodiments, the conductive line 1220 is electrically connected to the corresponding middle pattern MP through a conductive via CV4 penetrating through the first insulating layer 121, the buffer layer 120, the substrate 16, the buffer layer 100, and the gate insulating layer 102. A method of manufacturing the conductive via CV4 may include, for example, a drilling process (e.g., a laser drilling process, but is not limited thereto) or other process methods such as wet etching, dry etching, or dry and wet mixed etching to form a via penetrating through the first insulating layer 121, the buffer layer 120, the substrate 16, the buffer layer 100, and the gate insulating layer 102. When the first redistribution conductive layer 122 is formed, the via may be filled with the material of the first redistribution conductive layer 122. Besides, the conductive line 1240 may be electrically connected to the corresponding conductive line 1220 through a conductive via CV5 penetrating through the second insulating layer 123.

In some embodiments, as shown in FIG. 2, at least one conductive via structure 13 in the conductive via structures 13 of the electronic device 1 may include one top pattern TP, one conductive via CV3, one middle pattern MP, and one conductive via CV4 but is not limited thereto. In other embodiments, the conductive via structure 13 may not include the middle pattern MP and the conductive via CV3, and the conductive via CV4 may further penetrate through the first insulating layer 104 and the second insulating layer 106. In the case that the conductive via structure 13 includes the middle pattern MP and the conductive via CV3, the conductive via CV4 may not further penetrate through the first insulating layer 104 and the second insulating layer 106, such that a size of the conductive via CV4 (e.g., a thickness of the conductive via CV4 in the third direction D3) may be reduced, or the time and material required for and the difficulty of manufacturing the conductive via CV4 may be reduced or lowered.

In some embodiments, the top pattern TP and the conductive via CV3 in the conductive via structure 13 and the source SE, the drain DE, the conductive via CV1, and the conductive via CV2 in the pixel array structure 10 may be manufactured together. The middle pattern MP in the conductive via structure 13 and the gate GE and the bottom electrode BE in the pixel array structure 10 may be manufactured together. That is, the conductive via structure 13 may share at least one conductive layer (e.g., the first conductive layer 103 and the second conductive layer 107) with the pixel array structure 10. Further, the conductive via CV4 in the conductive via structure 13 and the conductive line 1220 of the redistribution structure 12 may be manufactured together, such that the conductive via structure 13 may share at least one conductive layer (e.g., the first redistribution conductive layer 122) with the redistribution structure 12 as well.

The driver circuit 20 may be disposed on the second redistribution conductive layer 124 of the redistribution structure 12 and is connected to the corresponding conductive line 1240. The driver circuit 20 may include an integrated circuit but is not limited thereto.

In each sub-pixel SP, a maximum size S of the conductive via structure 13 is determined by, for example, the conductive via (e.g., the conductive via CV4) with a maximum thickness in the conductive via structure 13. In some embodiments, the maximum size S (e.g., the maximum thickness of the conductive via CV4 in the first direction D1) of the conductive via structure 13 may be greater than or equal to S1 and is less than or equal to S2, that is, $S1 \leq S \leq S2$. $S1 = 2*d*\cot\theta + a1$ and $S2 = (25400/PPI) - a2$. In the foregoing formulas, d is the thickness of the conductive via (e.g., the thickness of the conductive via CV4 in the third direction D3), θ is an included angle between a side wall surface at a narrow end and a contact surface at the narrow end of the conductive via outside the conductive via (referring to FIG. 2), a1 is a contact width of the conductive via at the narrow end (e.g., a maximum contact width of the conductive via CV4 in the first direction D1), PPI is a sub-pixel density (sub-pixel per inch), and a2 is a line distance (e.g., a maximum line distance in the first direction D1) of the conductive lines CL of the redistribution structure 12. In some embodiments, $a1 \geq 2$ μm and $a2 \geq 2$ μm.

Other exemplary embodiments accompanied with other drawings are provided below to describe the electronic device of the disclosure. The same or similar reference numerals represent the same or similar elements in the following exemplary embodiments, and repeated description thereof is thus omitted. In addition, features in different exemplary embodiments may be combined with each other without conflict, and simple equivalent changes and modifications made in accordance with the specification or claims still fall within the scope of the disclosure.

Figure 4:
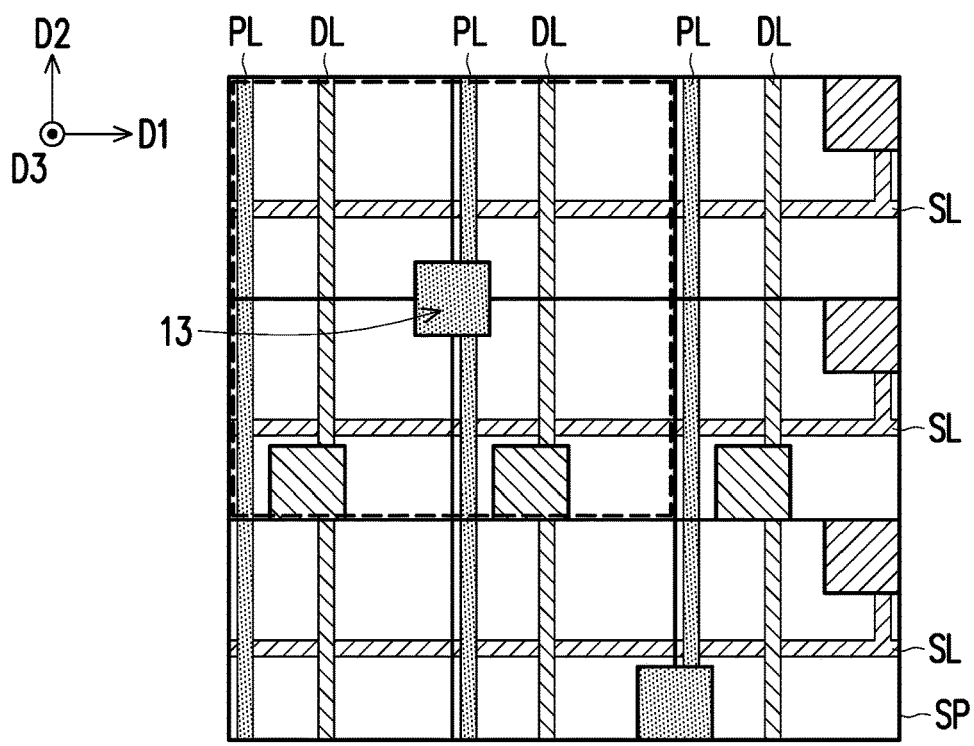
FIG. 4 to FIG. 6 respectively are local top schematic views of an electronic device according to a second embodiment to a fourth embodiment of the disclosure.

FIG. 4 is a local top schematic view of an electronic device according to a second embodiment of the disclosure. With reference to FIG. 4, in an electronic device 1A, two adjacent rows of sub-pixels SP (e.g., the six sub-pixels SP on the left in FIG. 4) share one signal line (e.g., the power line PL in FIG. 4), and the signal line (the power line PL in the middle in FIG. 4) is electrically connected to at least one conductive via structure 13. Through the design in which the signal line is shared, the number of the conductive via structures 13 may be reduced, such that the aperture ratio or light transmittance of the electronic device 1A may be increased. In some embodiments, the conductive via structure 13 may be disposed between four adjacent sub-pixels SP (as shown by the thick dashed frame), such that shielding rates of the four sub-pixels SP may be reduced, but the disclosure is not limited thereto. In other embodiments, the plural signal lines (e.g., the plural signal lines PL or the plural shared electrode lines that are not shown) may share one or several conductive via structures 13 as well. Further, the plural signal lines may be connected to one another through a connection line (not shown), such that the number of the conductive via structures 13 may be reduced, and the aperture ratio or light transmittance of the electronic device 1A may thus be increased. Any embodiment of the disclosure may be combined with the technical means described herein without conflict, and related description is not repeated below.

Figure 5:
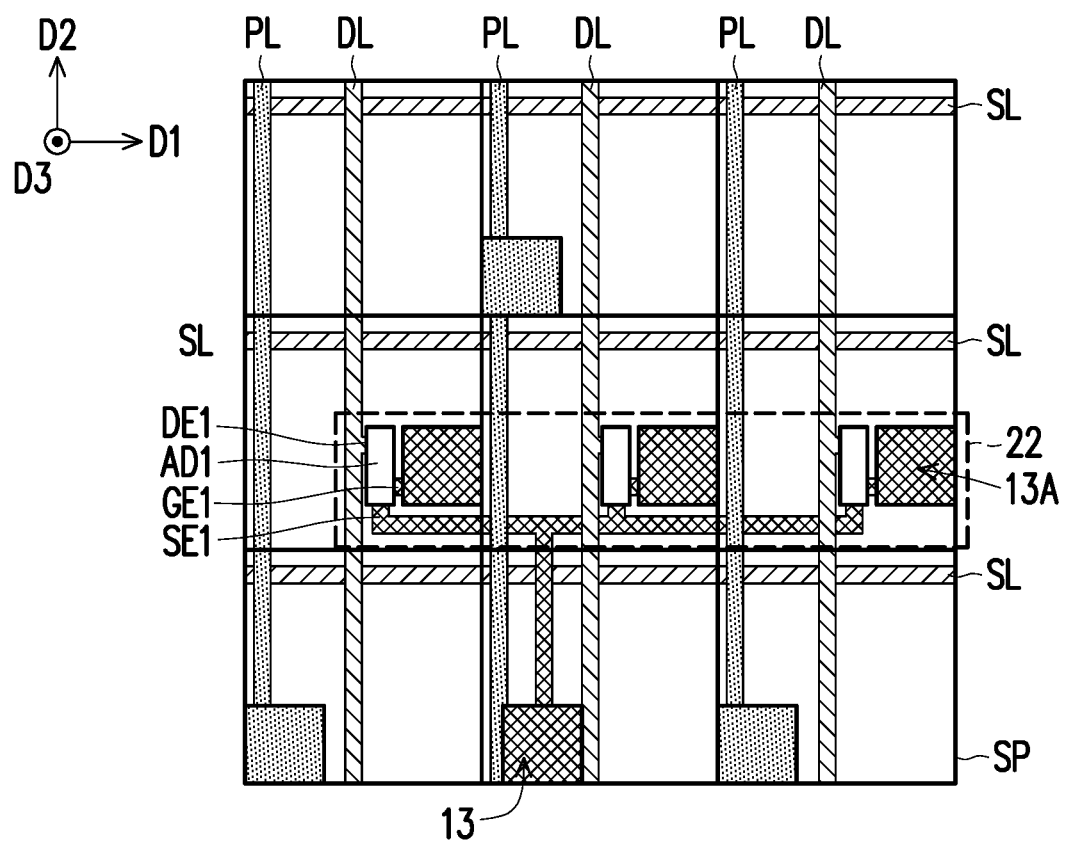

FIG. 5 is a local top schematic view of an electronic device according to a third embodiment of the disclosure. With reference to FIG. 5, in an electronic device 1B, the number of the conductive via structures 13 may be reduced through a circuit design of a data demultiplexer 22, such that the aperture ratio or light transmittance of the electronic device 1B may thus be increased. For instance, a plurality of gates GE1 of a plurality of active elements AD1 (three are schematically shown in FIG. 5) in the data demultiplexer 22 are electrically connected to a plurality of conductive via structures 13A to be electrically connected to the corresponding driver circuit (not shown) through the conductive via structures 13A, such that the active elements AD1 may be turned on in sequence (or turned off in sequence). A plurality of sources SE1 of the active elements AD1 are electrically connected to the same conductive via structure 13 to receive a data signal from the driver circuit (not shown) through the conductive via structure 13. A plurality of drains DE1 of the active elements AD1 are electrically connected to the data lines DL to transmit the data signal to the data lines DL. The number and arrangement position of the data demultiplexer 22 may be determined according to needs and are not limited herein.

Figure 6:
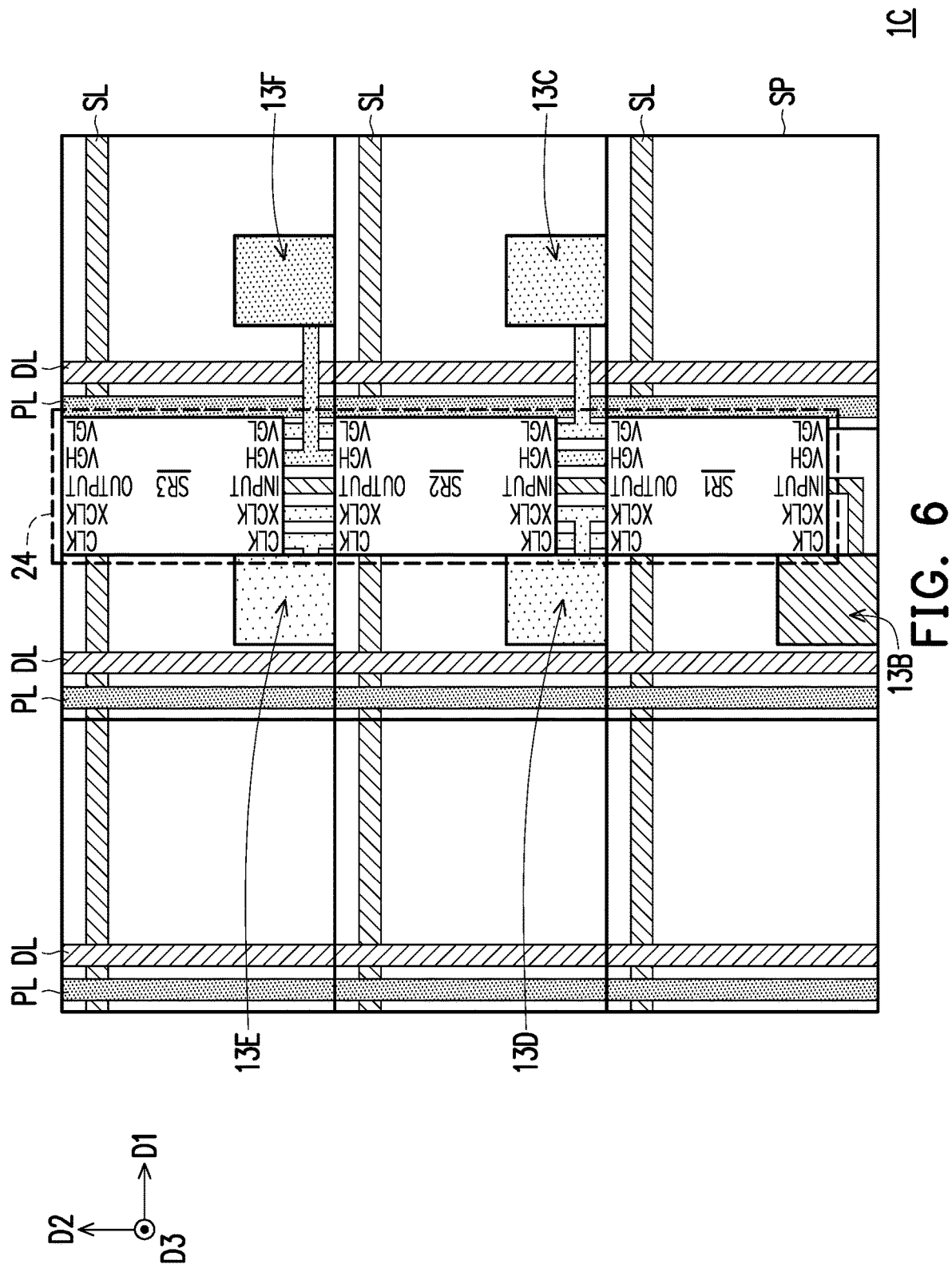
Figure 7A:
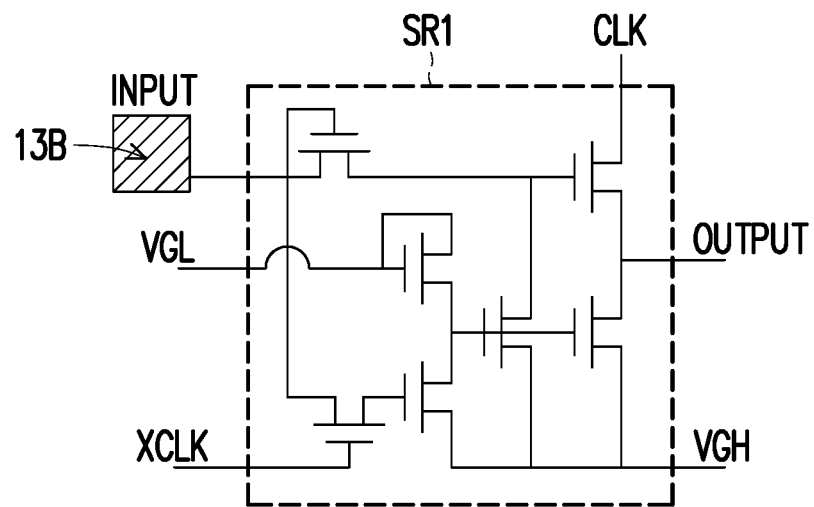
FIG. 7A to FIG. 7C respectively are circuit diagrams of a shift register unit SR1 to a shift register unit SR3 in FIG. 6.
Figure 7B:
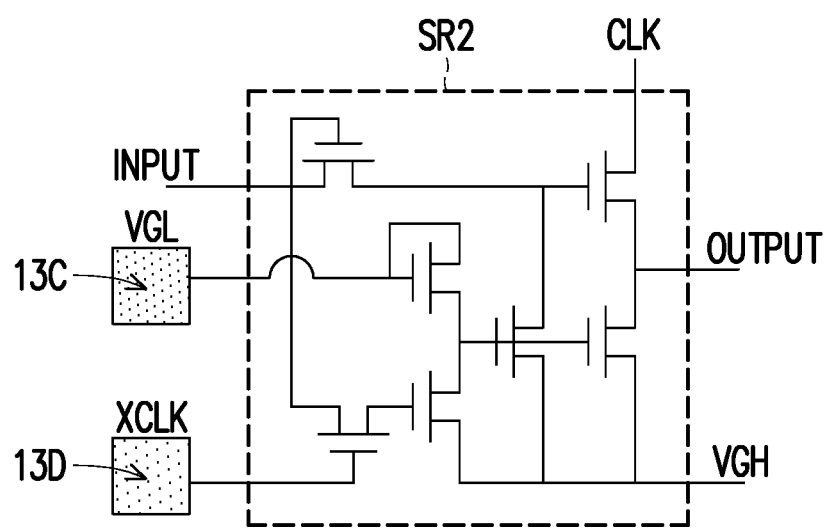
Figure 7C:
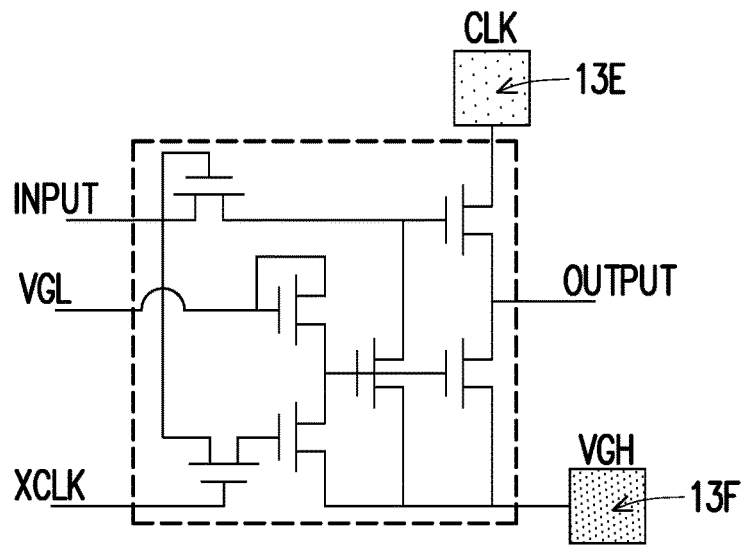

FIG. 6 is a local top schematic view of an electronic device according to a fourth embodiment of the disclosure. FIG. 7A to FIG. 7C respectively are circuit diagrams of a shift register unit SR1 to a shift register unit SR3 in FIG. 6. With reference to FIG. 6 to FIG. 7C, an electronic device 1C further includes a gate driver circuit (gate driver on array, GOA) 24. Compared to the arrangement where the gate driver circuit 24 is disposed at the periphery of the active region (the region where the sub-pixels SP are located), through the arrangement where the gate driver circuit 24 is disposed in the active region and is electrically connected to the driver circuit (not shown) through a conductive via structure 13B to a conductive via structure 13F, the design of a full narrow frame may thus be achieved. In some embodiments, the gate driver circuit 24 may include the shift register unit SR1 to a shift register unit SR3° Each of the shift register unit SR1 to the shift register unit SR3 includes a signal line CLK, a signal line XCLK, a signal line INPUT, a signal line OUTPUT, a signal line VGH, and a signal line VGL. The signal line INPUT in the shift register unit SR1 is electrically connected to the driver circuit (not shown) through the conductive via structure 13B. The signal line VGL and the signal line XCLK in a shift register unit SR2 are electrically connected to the driver circuit (not shown) respectively through a conductive via structure 13C and a conductive via structure 13D. The signal line CLK and the signal line VGH in the shift register unit SR3 are electrically connected to the driver circuit (not shown) respectively through a conductive via structure 13E and the conductive via structure 13F. The number and arrangement position of the shift register units may be determined according to needs and are not limited herein.

Figure 8:
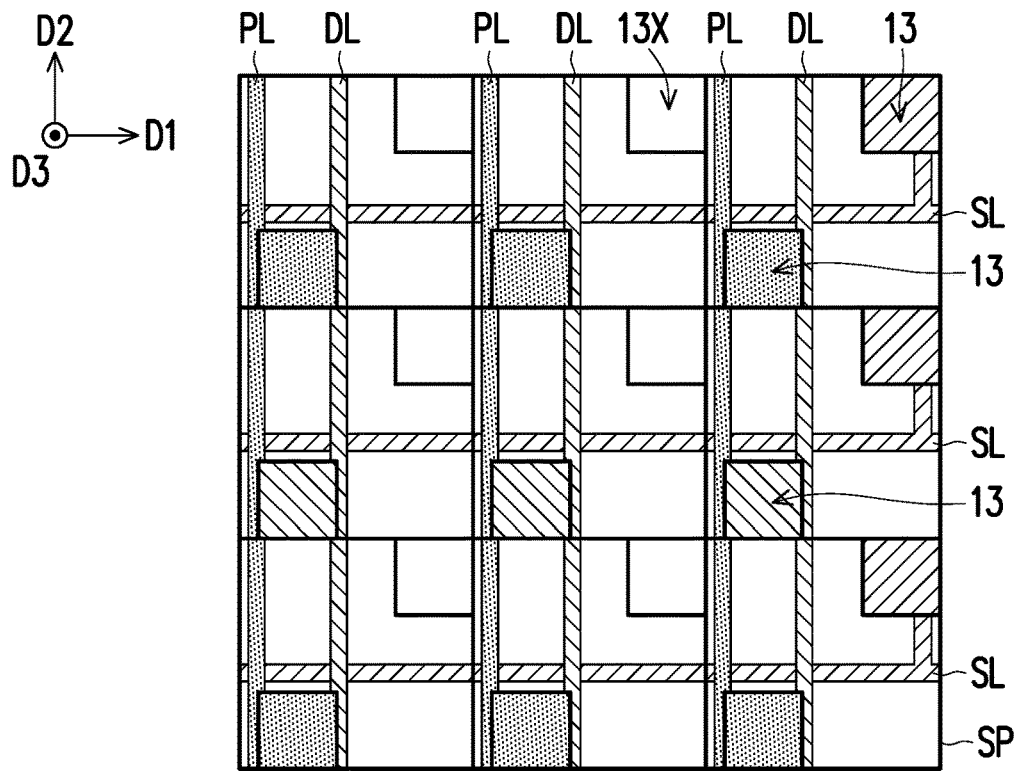
FIG. 8 and FIG. 9 respectively are a local top schematic view and a local cross-sectional schematic view of an electronic device according to a fifth embodiment of the disclosure.
Figure 9:
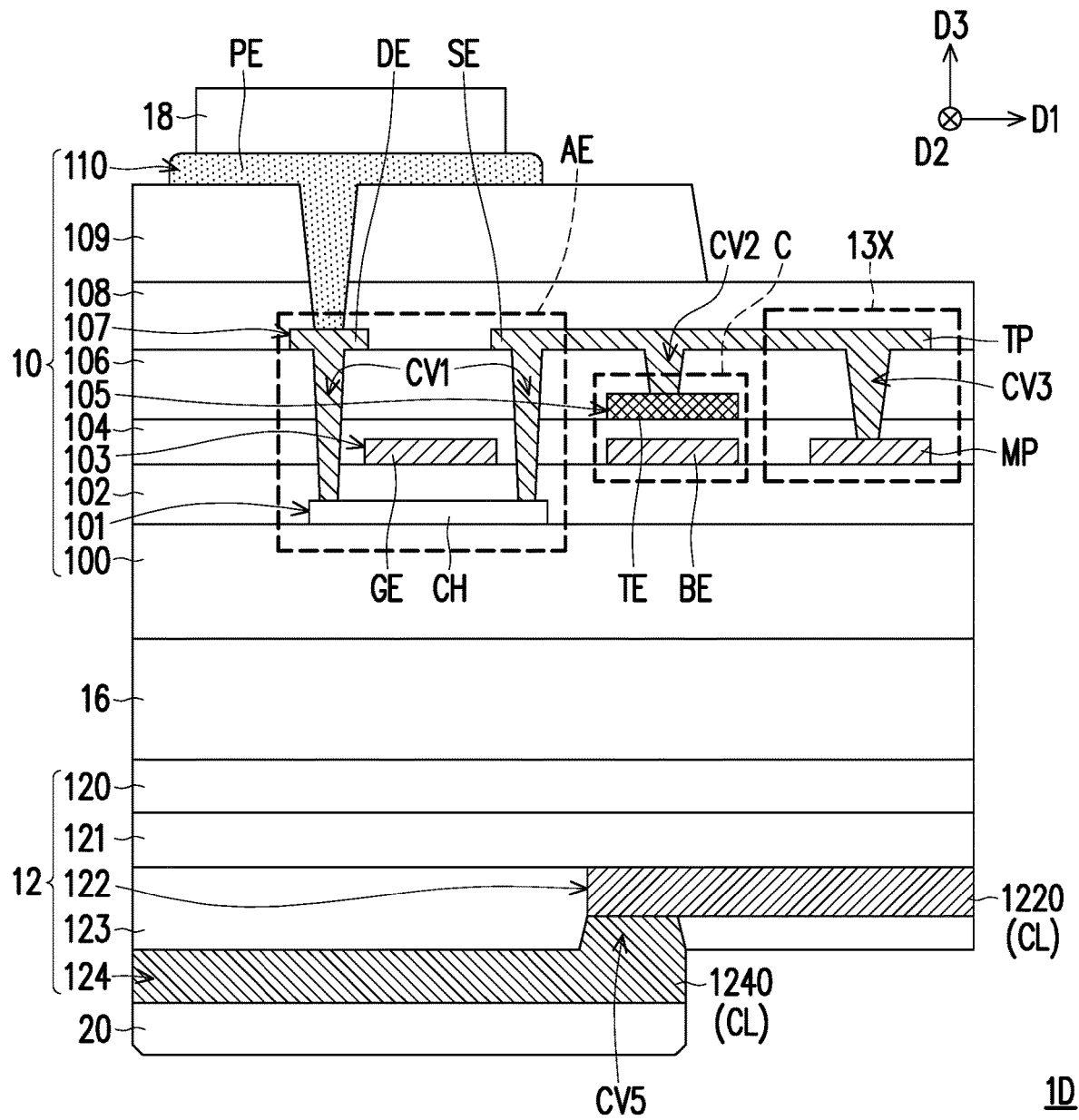

FIG. 8 and FIG. 9 respectively are a local top schematic view and a local cross-sectional schematic view of an electronic device according to a fifth embodiment of the disclosure. With reference to FIG. 8 and FIG. 9, in an electronic device 1D, considering process uniformity or visual effect uniformity of the electronic device 1D, the electronic device 1D may further include a plurality of dummy conductive via structures 13X. At least one of one conductive via structure 13 and one dummy conductive via structure 13X may be disposed in each sub-pixel SP, for example. As shown in FIG. 8, it is assumed that each sub-pixel SP is designed to include two conductive via structures, so that the two conductive via structures may be two conductive via structures 13, may be a combination of one conductive via structure 13 and one dummy conductive via structure 13X, or may be two dummy conductive via structures 13X (not shown).

In some embodiments, as shown in FIG. 9, at least one of the dummy conductive via structures 13X may include one top pattern TP, one conductive via CV3, and one middle pattern MP. That is, at least one of the dummy conductive via structures 13X may share at least one conductive layer (e.g., the first conductive layer 103 and the second conductive layer 107) with the pixel array structure 10. In addition, the dummy conductive via structures 13X may not be electrically connected to the conductive lines CL of the redistribution structure 12.

Figure 10:
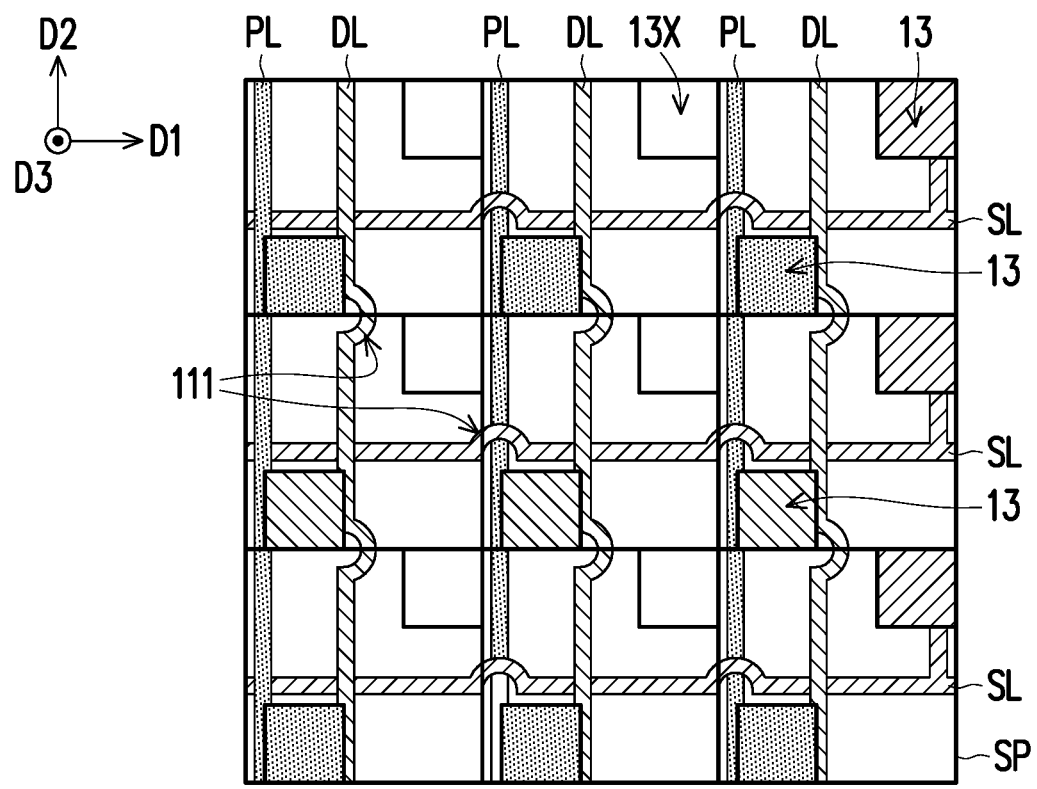
FIG. 10 is a local top schematic view of an electronic device according to a sixth embodiment of the disclosure.

FIG. 10 is a local top schematic view of an electronic device according to a sixth embodiment of the disclosure. With reference to FIG. 1, in an electronic device 1E, a pixel array structure further includes a plurality of stretchable electrodes 111. Portions of the signal lines (e.g., the scan lines SL or the data lines DL) may be formed by the stretchable electrodes 111. For instance, at least one of the stretchable electrodes 111 may be located at a junction of two adjacent sub-pixels SP and connects two portions of the same signal line (e.g., the scan line SL or the d DL) located in the two adjacent sub-pixels SP. In some other embodiments, the signal lines (e.g., the scan lines SL or the data lines DL) may be entirely formed by the stretchable electrodes 111. The stretchable electrodes 111 exhibit high stretchability and conductivity. For instance, the material of the stretchable electrodes 111 may include, but is not limited to, a carbon-based nano material, a metal nano material, or a combination thereof.

FIG. 11 is a local cross-sectional schematic view of an electronic device according to a seventh embodiment of the disclosure. With reference to FIG. 11, in an electronic device 1F, the pixel array structure 10 is located between the redistribution structure 12 and the substrate 16, and the element layer 18 is located between the redistribution structure 12 and the pixel array structure 10. For instance, the buffer layer 120 of the redistribution structure 12 may be disposed on the element layer 18, the third conductive layer 110, and the fourth insulating layer 109. In addition, in the conductive via structure, a conductive via CV4F penetrates through the first insulating layer 121, the buffer layer 120, the fourth insulating layer 109, and the third insulating layer 108, and two opposite ends of the conductive via CV4F are respectively connected to the conductive line 1220 and the top pattern TP. The electronic device 1F may be applied in a built-in sensor display apparatus, for example, but is not limited thereto.

The middle conductive layer 105 and the capacitor C are not shown in FIG. 11. According to different needs, the pixel array structure 10 of the electronic device 1F may include or may not include the middle conductive layer 105 or the capacitor C. Any embodiment of the disclosure may be combined with the technical means described herein without conflict, and related description is not repeated below.

Figure 12:
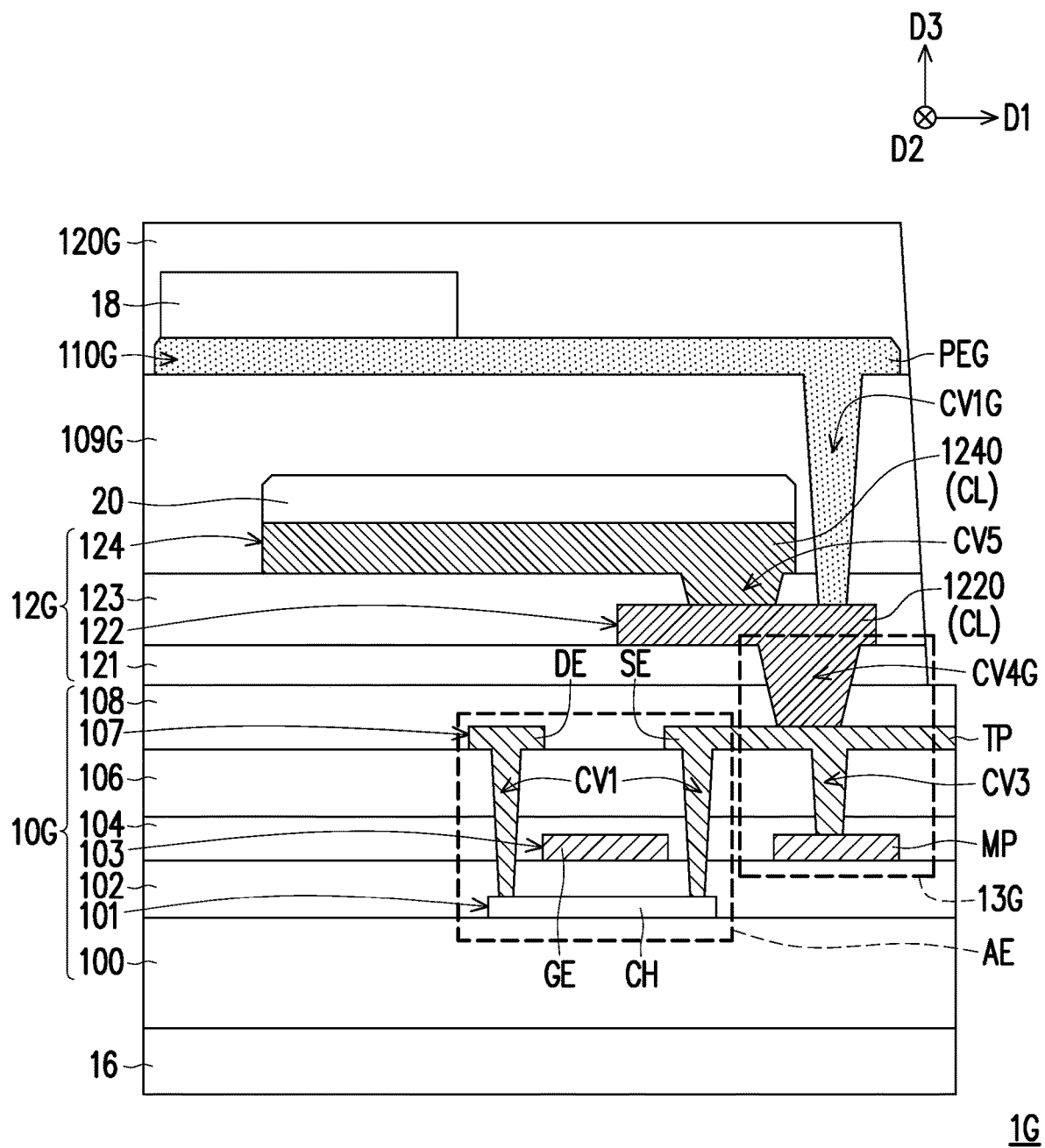

FIG. 12 is a local cross-sectional schematic view of an electronic device according to an eighth embodiment of the disclosure. With reference to FIG. 12, in an electronic device 1G, a redistribution structure 12G is located between the element layer 18 and a pixel array structure 10G.

In some embodiments, as shown in FIG. 12, after the buffer layer 100 to the third insulating layer 108 of the pixel array structure 10G are formed on the substrate 16 in sequence, the first insulating layer 121 to the second redistribution conductive layer 124 of the redistribution structure 12G may be formed next, and then the driver circuit 20, an insulating layer 109G, a conductive layer 110G, the element layer 18, and a buffer layer 120G are formed in sequence. In such an architecture, the pixel array structure 10G may not include the fourth insulating layer 109 nor the third conductive layer 110, and the redistribution structure 12G may not include the buffer layer 120. In addition, the first insulating layer 121 of the redistribution structure 12G is disposed on the third insulating layer 108 of the pixel array structure 10G. In a conductive via structure 13G, a conductive via CV4G penetrates through the first insulating layer 121 and the third insulating layer 108, and two opposite ends of the conductive via CV4G are respectively connected to the conductive line 1220 and the top pattern TP. The insulating layer 109G of the electronic device 1G is disposed on the driver circuit 20 and the second insulating layer 123. The conductive layer 110G of the electronic device 1G is disposed on the insulating layer 109G. The conductive layer 110G may be a patterned conductive layer and includes a plurality of pixel electrodes PEG (one pixel electrode PEG is schematically shown in FIG. 12). The pixel electrode PEG may penetrate through the insulating layer 109G and a conductive via CV1G of the second insulating layer 123 and is electrically connected to the conductive line 1220. The buffer layer 120G of the electronic device 1G is disposed on the element layer 18 and the conductive layer 110G.

Figure 13:
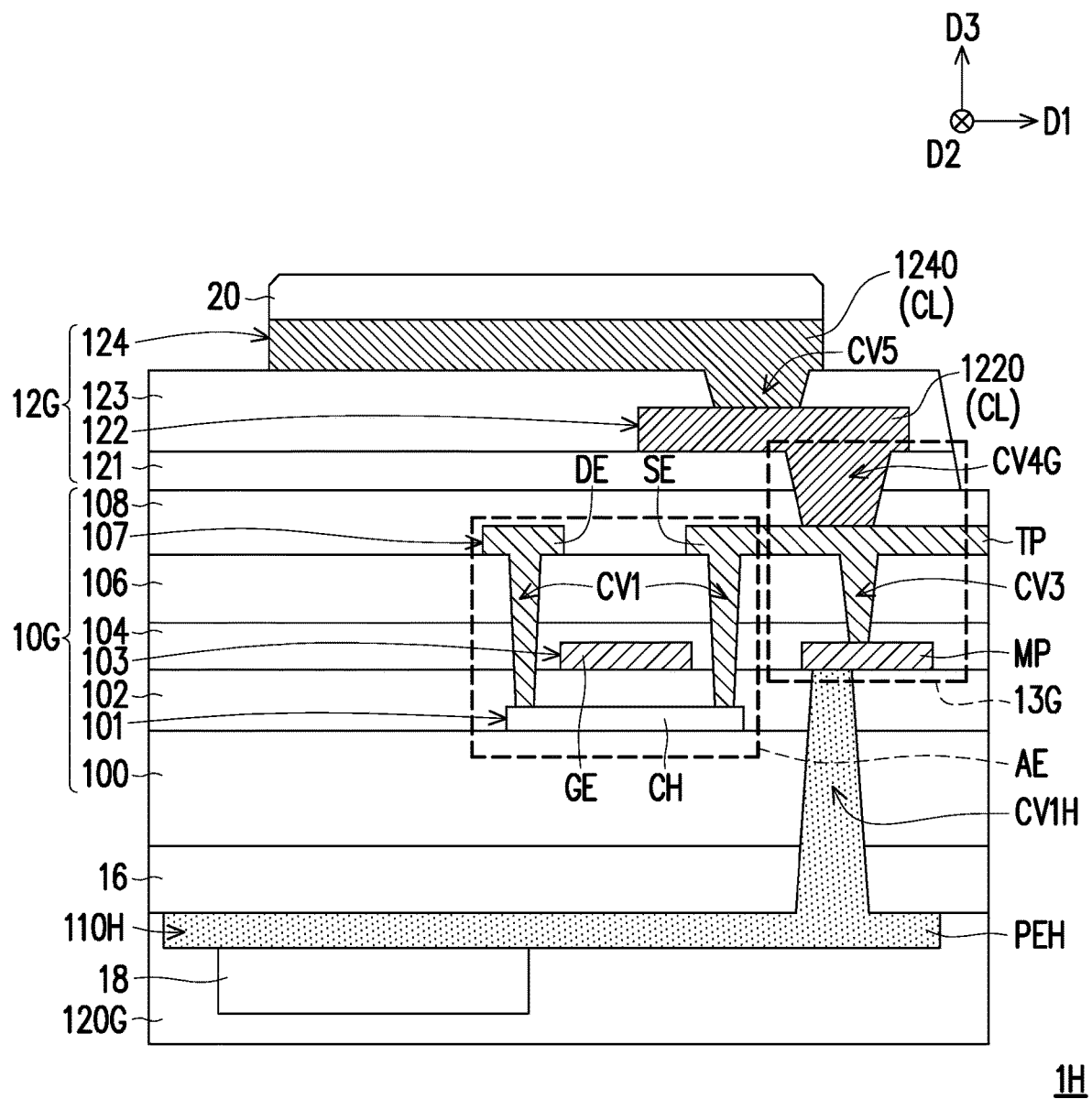

FIG. 13 is a local cross-sectional schematic view of an electronic device according to a ninth embodiment of the disclosure. With reference to FIG. 13, in an electronic device 1H, the substrate 16 is located between the element layer 18 and the pixel array structure 10G. For instance, the electronic device 1H may not include the insulating layer 109G. Further, a conductive layer 110H, the element layer 18, and the buffer layer 120G of the electronic device 1H may be disposed in sequence on a surface of the substrate 16 away from the pixel array structure 10G. Herein, a pixel electrode PEH of the conductive layer 110H is electrically connected to the corresponding middle pattern MP through a conductive via CV1H penetrating through the substrate 16, the buffer layer 100, and the gate insulating layer 102.

Figure 14:
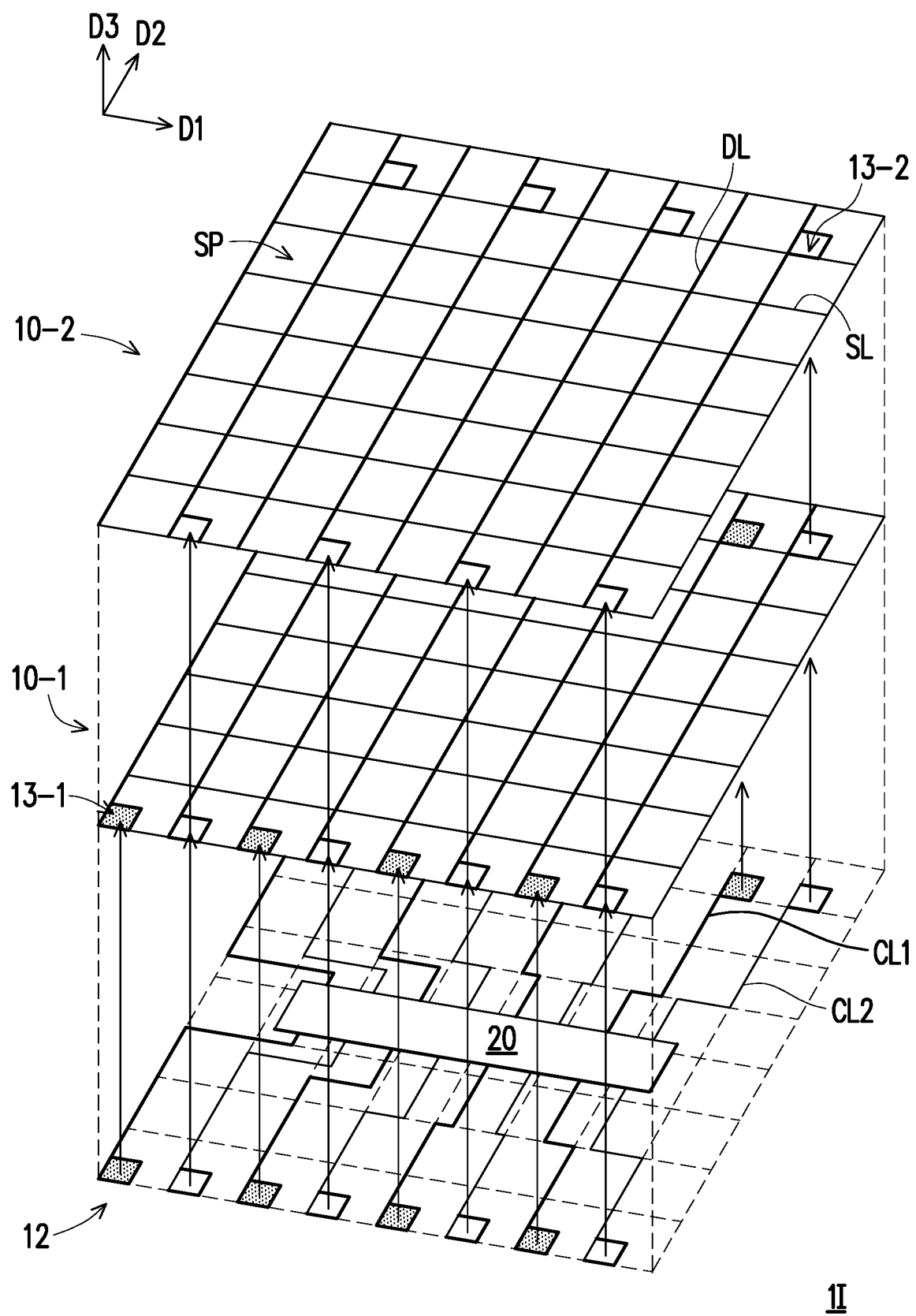
FIG. 14 and FIG. 15 respectively are a local three-dimensional schematic view and a local cross-sectional schematic view of an electronic device according to a tenth embodiment of the disclosure.
Figure 15:
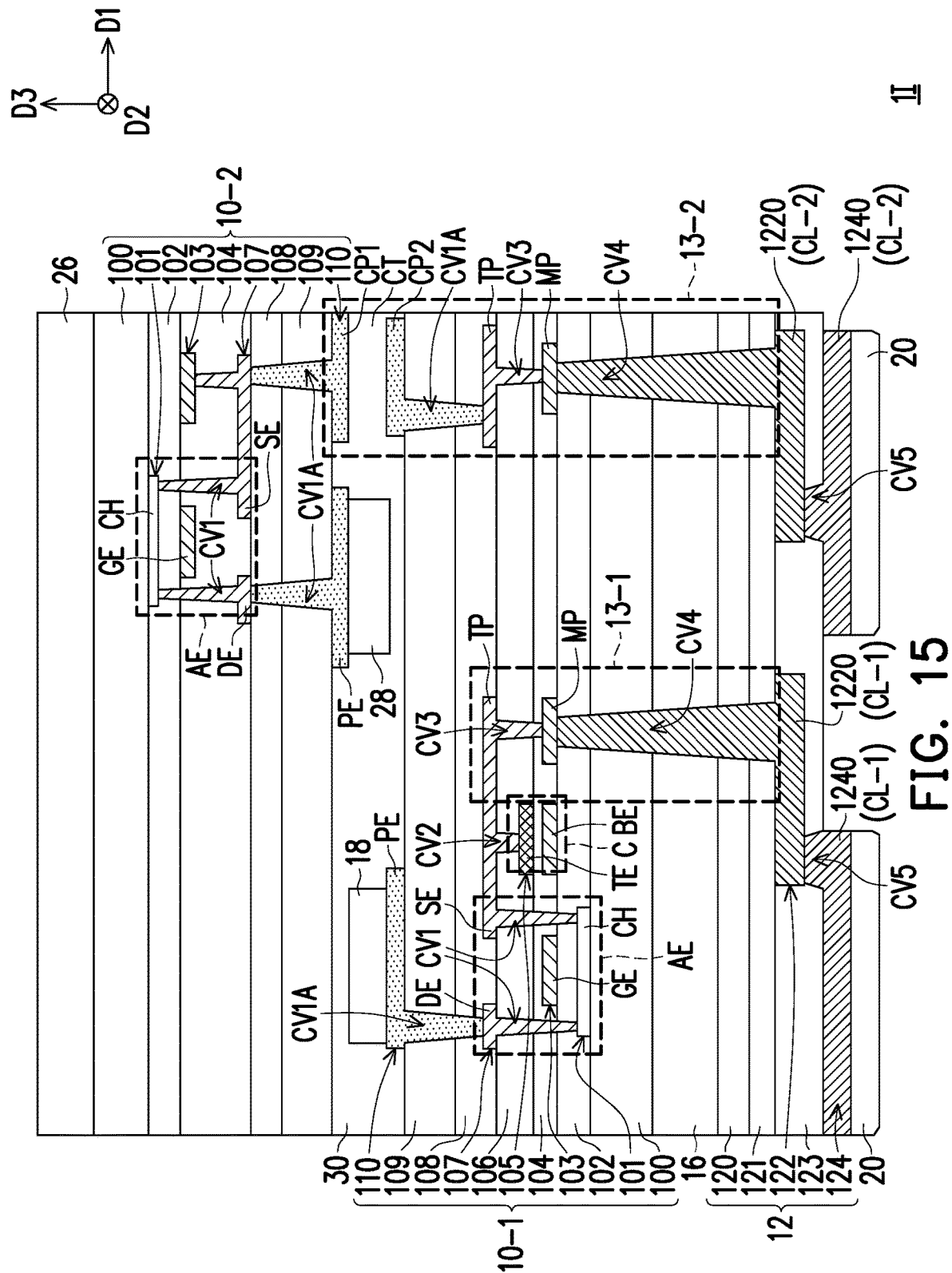

FIG. 14 and FIG. 15 respectively are a local three-dimensional schematic view and a local cross-sectional schematic view of an electronic device according to a tenth embodiment of the disclosure. With reference to FIG. 14 and FIG. 15, an electronic device 1I includes a plurality of pixel array structures, such as a first pixel array structure 10-1 and a second pixel array structure 10-2. The first pixel array structure 10-1 is located between the second pixel array structure 10-2 and the redistribution structure 12. The conductive lines of the redistribution structure 12 include a plurality of first conductive lines CL-1 and a plurality of second conductive lines CL-2. For convenience of distinction, solid lines with different line widths are used in FIG. 14 to represent the first conductive lines CL-1 and the second conductive lines CL-2. The conductive via structures include a plurality of first conductive via structures 13-1 and a plurality of second conductive via structures 13-2. For convenience of distinction, regions where the first conductive via structures 13-1 and the second conductive via structures 13-2 are located are marked with different background colors. A plurality of signal lines (e.g., the data lines DL) in the first pixel array structure 10-1 are electrically connected to a plurality of first conductive lines CL1 of the redistribution structure 12 through the first conductive via structures 13-1. Further, a plurality of signal lines (e.g., the data lines DL) in the second pixel array structure 10-2 are electrically connected to a plurality of second conductive lines CL2 of the redistribution structure 12 through the second conductive via structures 13-2. It is schematically shown in FIG. 14 that plural first conductive lines CL1 and plural second conductive lines CL2 are electrically connected to one driver circuit 20. Alternatively, plural first conductive lines CL1 and plural second conductive lines CL2 may be electrically connected to plural driver circuits 20 (as shown in FIG. 15).

With reference to FIG. 15, description of the elements/film layers of the first pixel array structure 10-1 and the redistribution structure 12 and a relative arrangement relationship therebetween may be found with reference to the foregoing description and is not repeated herein. The second pixel array structure 10-2 is disposed on a substrate 26 and may exhibit a structure similar to the first pixel array structure 10-1. The middle conductive layer 105, the second insulating layer 106 and the capacitor C are not shown in the second pixel array structure 10-2 in FIG. 15. According to different needs, the second pixel array structure 10-2 may include or may not include the middle conductive layer 105, the second insulating layer 106, or the capacitor C. An element layer 28 is disposed on the pixel electrode PE of the second pixel array structure 10-2. The element layer 28 and the element layer 18 may be configured to provide different functions, such as two of the lighting function, the display function, or the light sensing function, but are not limited thereto. For instance, one of the element layer 28 and the element layer 18 may include, for example, a mini LED array or a micro LED array, to provide the lighting function. The other one of the element layer 28 and the element layer 18 may include, for example, a liquid crystal layer to provide the display function. As another alternative, one of the element layer 28 and the element layer 18 may include a liquid crystal layer, an electrophoretic layer, an OLED, a mini LED array, or a micro LED array to provide the display function. The other one of the element layer 28 and the element layer 18 may include, for example, a light sensing element array to provide the light sensing function.

In some embodiments, as shown in FIG. 15, the conductive via structure 13-1 may exhibit a structure similar to the conductive via structure 13 shown in FIG. 2. That is, the first conductive via structure 13-1 may include one top pattern TP, one conductive via CV3, one middle pattern MP, and one conductive via CV4 but is not limited thereto. Further, in addition to one top pattern TP, one conductive via CV3, one middle pattern MP, and one conductive via CV4, the second conductive via structure 13-2 may further include the conductive via CV1A, a conductive pattern CP2, a connection member CT, and a conductive pattern CP1. The conductive pattern CP2 may be formed together with the pixel electrode PE in the first pixel array structure 10-1, and the conductive pattern CP2 may be electrically connected to the top pattern TP through the conductive via CV1A. The conductive pattern CP1 may be formed together with the pixel electrode PE of the second pixel array structure 10-2. After the second pixel array structure 10-2 and the element layer 28 are disposed on the substrate 26, the substrate 26 may be turned over. In this way, the second pixel array structure 10-2 faces the first pixel array structure 10-1, and the first pixel array structure 10-1 is bonded to the second pixel array structure 10-2 through an adhesive layer 30. Further, the conductive pattern CP1 is electrically connected to the conductive pattern CP2 through the connection member CT. The connection member CT includes, for example, conductive glue or welding parts, but is not limited thereto.

Figure 16:
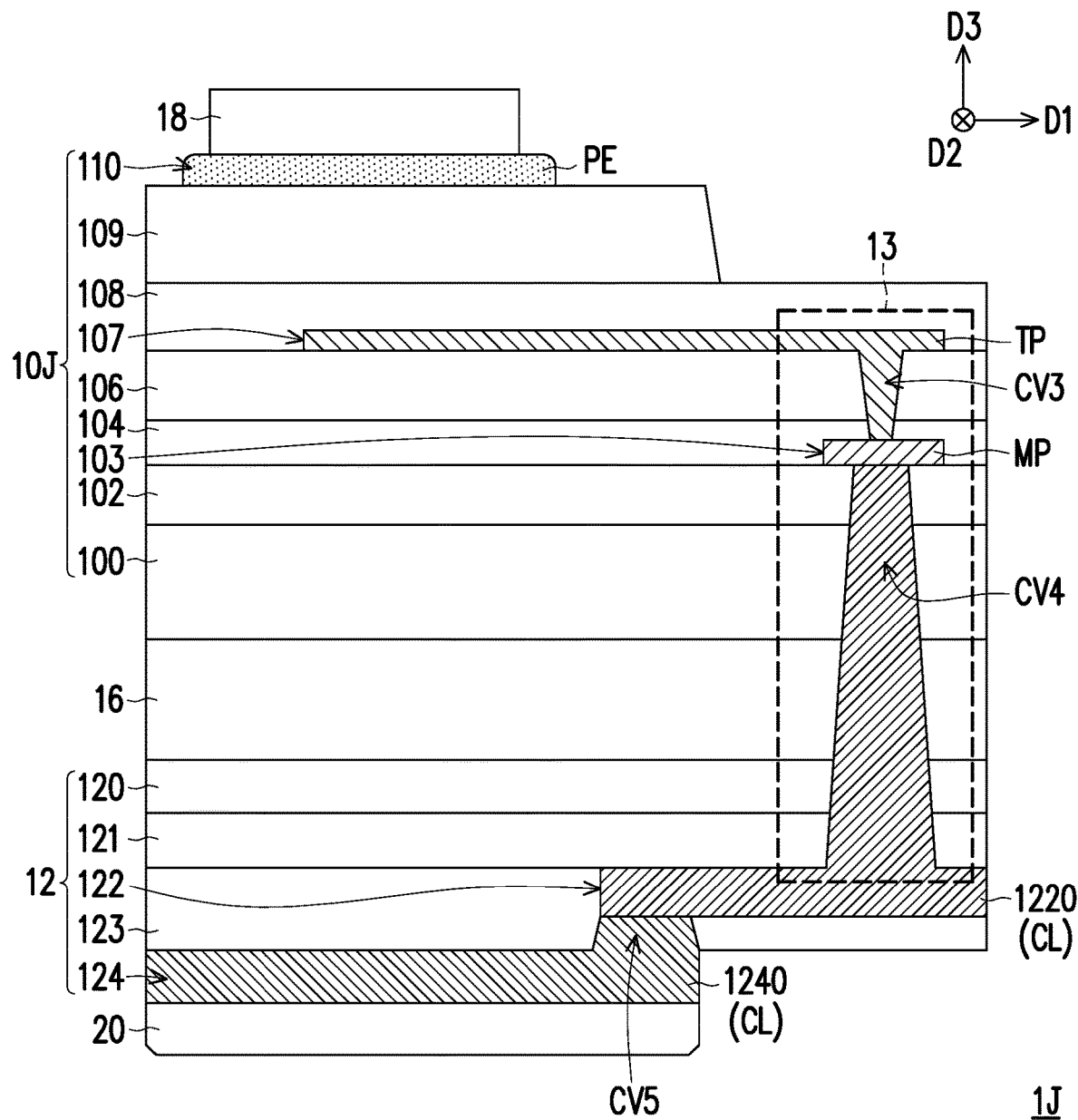
FIG. 16 and FIG. 17 respectively are a local cross-sectional schematic view and a local top schematic view of an electronic device according to an eleventh embodiment of the disclosure.
Figure 17:
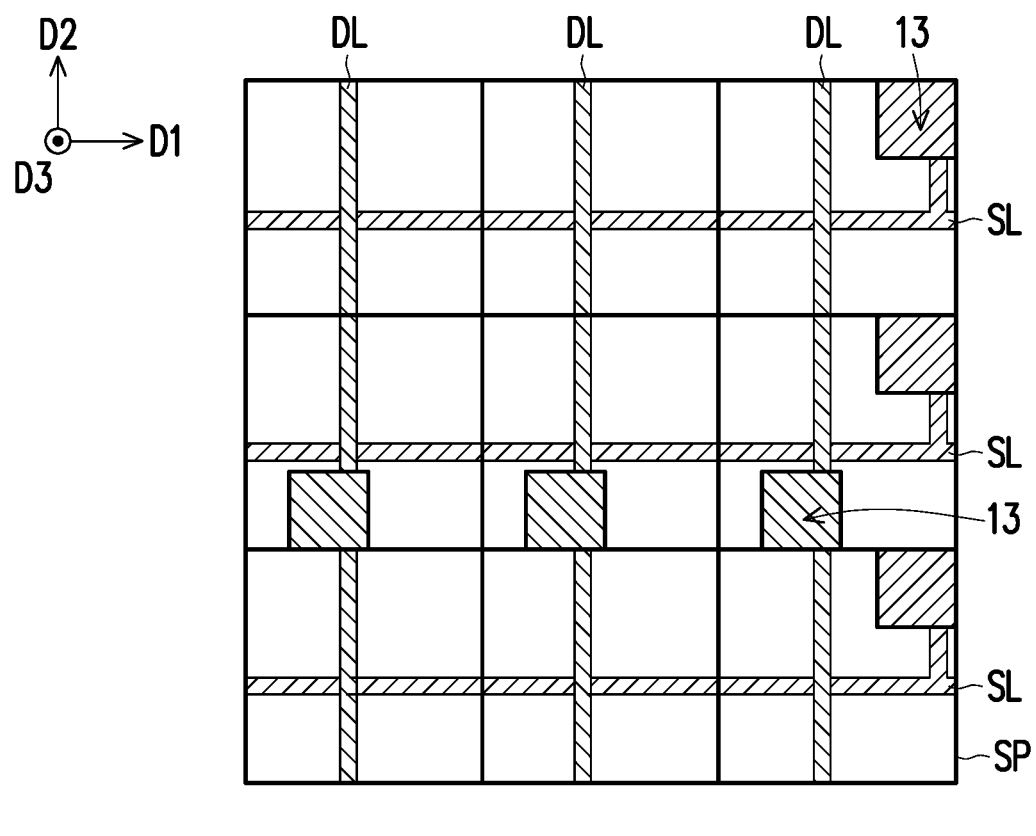

FIG. 16 and FIG. 17 respectively are a local cross-sectional schematic view and a local top schematic view of an electronic device according to an eleventh embodiment of the disclosure. With reference to FIG. 16 and FIG. 17, in an electronic device 1J, a pixel array structure 10J is, for example, a passive pixel array structure. Besides, the pixel array structure 10J may not include the power line PL, the active element AD, the capacitor C, the semiconductor layer 101, and the middle conductive layer 105 but is not limited thereto.

In an embodiment of the disclosure, the signal lines of the pixel array structure may be connected to the conductive lines of the redistribution structure through the conductive via structures and are connected to a driver system end (e.g., the driver circuit) further through the conductive lines of the redistribution structure. In this way, a peripheral circuit may be not disposed in the electronic device, such that the design of a full narrow frame or a borderless frame may thus be achieved. In addition, for small sizes or high resolution rises, a suitable signal transmission path may be provided through design (e.g., sizes, numbers, or locations) of at least one of the conductive via structures, the conductive lines, and the driver circuit, such that the resistive-capacitive loading problem may be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
a pixel array structure, comprising a plurality of signal lines;
a redistribution structure, overlapping the pixel array structure, comprising a plurality of conductive lines; and
a plurality of conductive via structures, electrically connecting the signal lines of the pixel array structure and the conductive lines of the redistribution structure, wherein at least one of the conductive via structures comprises a middle pattern, a top pattern and a conductive via connected between the middle pattern and the top pattern, and wherein:
the middle pattern shares a first conductive layer with the pixel array structure;
the top pattern and the conductive via share a second conductive layer with the pixel array structure; and
the middle pattern has a different shape than the conductive via,
wherein the plurality of signal lines comprises a plurality of power lines and a plurality of data lines, the plurality of power lines and the plurality of data lines are electrically connected to different conductive via structures, the pixel array structure further comprises a plurality of sub-pixels, two adjacent rows of the sub-pixels share one power line electrically connected to at least one of the conductive via structures, and
wherein the plurality of signal lines further comprises a plurality of scan lines, which intersect with the plurality of power lines and the plurality of data lines.

2. The electronic device according to claim 1, further comprising at least one of a data demultiplexer, a shift register unit, and a gate drive circuit.

3. The electronic device according to claim 1, further comprising:
a plurality of dummy conductive via structures, wherein at least one of the dummy conductive via structures shares at least one conductive layer with the pixel array structure, and at least one of one conductive via structure and one dummy conductive via structure is disposed in each of the sub-pixels.

4. The electronic device according to claim 1, wherein the pixel array structure further comprises a plurality of stretchable electrodes, at least one of the stretchable electrodes is located at a junction of two adjacent sub-pixels and connects two portions of the same signal line located in the two adjacent sub-pixels.

5. The electronic device according to claim 1, further comprising:
a substrate, wherein the pixel array structure and the redistribution structure are located on the substrate; and
an element layer, disposed on the substrate, overlapping the pixel array structure and the redistribution structure.

6. The electronic device according to claim 5, wherein the element layer comprises a display medium layer or a photoelectric conversion layer.

7. The electronic device according to claim 5, wherein the pixel array structure and the redistribution structure are disposed on opposite surfaces of the substrate, and the plurality of conductive via structures penetrate through the substrate to electrically connect the signal lines of the pixel array structure and the conductive lines of the redistribution structure, wherein the element layer is disposed on one side of the pixel array structure away from the substrate.

8. The electronic device according to claim 1, wherein the electronic device comprises a plurality of the pixel array structures, the pixel array structures comprise a first pixel array structure and a second pixel array structure, and the first pixel array structure is located between the second pixel array structure and the redistribution structure,
wherein the conductive lines of the redistribution structure comprise a plurality of first conductive lines and a plurality of second conductive lines, and the conductive via structures comprise a plurality of first conductive via structures and a plurality of second conductive via structures, and
wherein a plurality of signal lines of the first pixel array structure are electrically connected to the first conductive lines of the redistribution structure through the first conductive via structures, and a plurality of signal lines of the second pixel array structure are electrically connected to the second conductive lines of the redistribution structure through the second conductive via structures.

9. The electronic device according to claim 1, wherein each of the signal lines in the pixel array structure is electrically connected to one corresponding conductive line in the redistribution structure through at least one of the conductive via structures.

10. The electronic device according to claim 1, wherein the conductive lines of the redistribution structure at least partially overlap the signal lines of the pixel array structure.

11. The electronic device according to claim 1, further comprising:
   a driver circuit, overlapping the pixel array structure and the redistribution structure, wherein the driver circuit is electrically connected to the signal lines of the pixel array structure through the conductive lines of the redistribution structure and the conductive via structures.

12. The electronic device according to claim 1, wherein at least conductive via structure in the conductive via structures satisfies:

$$S1 \leq S \leq S2;$$

$$S1 = 2*d* \cot\theta + a1; \text{ and}$$

$$S2 = (25400/PPI) - a2,$$

wherein S is a maximum size of the at least one conductive via structure, d is a thickness of a conductive via with a maximum thickness in the at least one conductive via structure, θ is an included angle between a side wall surface at a narrow end and a contact surface at the narrow end of the conductive via with the maximum thickness outside the conductive via, a1 is a contact width of the conductive via at the narrow end, PPI is a pixel density, and a2 is a line distance of the conductive lines of the redistribution structure.

* * * * *